United States Patent
Chang et al.

(10) Patent No.: US 10,061,962 B2
(45) Date of Patent: Aug. 28, 2018

(54) FINGERPRINT IDENTIFICATION MODULE AND MANUFACTURING METHOD THEREOF

(71) Applicant: PRIMAX ELECTRONICS LTD., Taipei (TW)

(72) Inventors: Ching-Hui Chang, Taipei (TW); Tung-Ying Wu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 14 days.

(21) Appl. No.: 15/411,189

(22) Filed: Jan. 20, 2017

(65) Prior Publication Data
US 2017/0243046 A1  Aug. 24, 2017

Related U.S. Application Data

(60) Provisional application No. 62/297,355, filed on Feb. 19, 2016.

(51) Int. Cl.
| | |
|---|---|
| G06K 9/00 | (2006.01) |
| H01L 21/48 | (2006.01) |
| H01L 21/56 | (2006.01) |
| H01L 21/78 | (2006.01) |
| H01L 23/04 | (2006.01) |
| H01L 23/08 | (2006.01) |
| H01L 23/10 | (2006.01) |
| H01L 23/31 | (2006.01) |
| H01L 23/00 | (2006.01) |

(52) U.S. Cl.
CPC ......... *G06K 9/0002* (2013.01); *G06K 9/0053* (2013.01); *H01L 21/4875* (2013.01); *H01L 21/565* (2013.01); *H01L 21/78* (2013.01); *H01L 23/04* (2013.01); *H01L 23/08* (2013.01); *H01L 23/10* (2013.01); *H01L 23/3142* (2013.01); *H01L 24/49* (2013.01); *H01L 24/85* (2013.01); *H01L 21/561* (2013.01); *H01L 23/3107* (2013.01); *H01L 2224/48091* (2013.01)

(58) Field of Classification Search
CPC . G06K 9/0053; H01L 21/4875; H01L 21/565; H01L 21/78; H01L 24/49
See application file for complete search history.

(56) References Cited

U.S. PATENT DOCUMENTS

| | | | | |
|---|---|---|---|---|
| 2008/0079100 | A1* | 4/2008 | Manansala | G06K 9/00053 257/415 |
| 2015/0296622 | A1* | 10/2015 | Jiang | G01L 1/2268 361/750 |
| 2017/0213097 | A1* | 7/2017 | Vogel | G06K 9/00013 |

* cited by examiner

*Primary Examiner* — Phuoc Tran
(74) *Attorney, Agent, or Firm* — Kirton McConkie; Evan R. Witt

(57) ABSTRACT

A fingerprint identification module includes a substrate, a fingerprint sensor die, a covering adhesive layer, a cover plate and a mold compound layer. The fingerprint sensor die is attached on the substrate for sensing a fingerprint image. The covering adhesive layer is formed on a top surface of the fingerprint sensor die. The cover plate is attached on the covering adhesive layer. The mold compound layer is formed over the substrate. The fingerprint sensor die, the covering adhesive layer and the cover plate over the substrate are molded together through the mold compound layer, and the cover plate is exposed. The fingerprint identification module has small thickness and enhanced sensing accuracy.

3 Claims, 5 Drawing Sheets

FINGERPRINT IDENTIFICATION MODULE AND MANUFACTURING METHOD THEREOF

FIELD OF THE INVENTION

The present invention relates to a biometric identification device, and more particularly to a fingerprint identification module.

BACKGROUND OF THE INVENTION

A fingerprint identification device is used in an electronic product to read a fingerprint image. After the fingerprint identification device confirms that the read fingerprint image complies with a predetermined fingerprint file, the electronic product is unlocked. In the early stage, the fingerprint identification device is used in an access control system. Recently, with increasing development of the smart phone technologies, smart phones are usually equipped with fingerprint identification devices. In comparison with the fingerprint identification device of the access control system, the thickness of the fingerprint identification device is gradually reduced because the trend of designing the smart phone is toward slimness. Therefore, it is important to increase the accuracy of the fingerprint identification device to sense the fingerprint image.

FIG. 1 is a schematic view illustrating the structure of a conventional fingerprint identification module. As shown in FIG. 1, the conventional fingerprint identification module 10 comprises a fingerprint sensor die 11, a rigid circuit board 12, a flexible circuit board 13, a mold compound layer 14, a cover plate 16 and a reinforcement plate 17. The reinforcement plate 16 is used for increasing the flatness of the flexible circuit board 13. The fingerprint sensor die 11 is attached on the rigid circuit board 12 through an adhesive layer 12A. Moreover, the fingerprint sensor die 11 is connected with the rigid circuit board 12 through wires W. The rigid circuit board 12 and the flexible circuit board 13 are combined together through a soldering layer 13A. The flexible circuit board 13 and the reinforcement plate 17 are combined together through an adhesive layer 17A. The cover plate 16 is attached on the mold compound layer 14 through an adhesive layer 15.

For example, the fingerprint sensor die 11 is a capacitive fingerprint sensor die. When a user's finger is placed on the cover plate 16, the fingerprint sensor die 11 senses the fingerprint image and transmits the fingerprint image to an electronic device through the rigid circuit board 12 and the flexible circuit board 13. Consequently, the fingerprint image can be recognized by the electronic device. However, for those skilled in the art, the conventional fingerprint identification module 10 of FIG. 1 still has some drawbacks. Generally, in case that distance between a sensing surface of the fingerprint sensor die 11 and the finger is smaller, the accuracy of the fingerprint sensor die 11 (e.g., the capacitive fingerprint sensor die) for sensing the fingerprint is higher. As shown in FIG. 1, the overall thickness of the adhesive layer 15 and the cover plate 16 is D1, and the thickness of the mold compound layer 14 overlying the fingerprint sensor die 11 is D2. The distance between the finger and the sensing surface of the fingerprint sensor die 11 is equal to the sum of D1 and D2. For manufacturing the conventional fingerprint identification module 10, a molding process is firstly performed to form the mold compound layer 14 to encapsulate the fingerprint sensor die 11 and the wires W, and then the adhesive layer 15 is coated on the top surface of the mold compound layer 14 to attach the cover plate 16. During the process of forming the mold compound layer 14, the thickness D2 of the mold compound layer 14 overlying the fingerprint sensor die 11 is unavoidable. The thickness D2 increases the distance between a sensing surface of the fingerprint sensor die 11 and the finger.

The uneven thickness of the mold compound layer 14 is another drawback of the fingerprint identification module 10 of FIG. 1. Since it is difficult to precisely control the stress of the package structure during the process of forming the mold compound layer 14, the thickness of the mold compound layer 14 is not uniformly distributed. Consequently, the surface of the mold compound layer 14 is suffered from warpage. When the warpage of the mold compound layer 14 occurs, the thickness of the adhesive layer 15 overlying the mold compound layer 14 is also uneven. That is, the two lateral regions are thicker than the middle region, or the two lateral regions are thinner than the middle region. Due to the uneven thickness, the fiducial capacitance sensed by the fingerprint sensor die 11 is inconsistent. Under this circumstance, the possible of resulting in misjudgment is increased.

SUMMARY OF THE INVENTION

The present invention provides a fingerprint identification module with small thickness and enhanced sensing accuracy and a manufacturing method of the fingerprint identification module.

In accordance with an aspect of the present invention, there is provided a fingerprint identification module. The fingerprint identification module includes a substrate, a fingerprint sensor die, a covering adhesive layer, a cover plate and a mold compound layer. The substrate includes plural electrical contacts. The fingerprint sensor die is attached on the substrate for sensing a fingerprint image. The fingerprint sensor die is connected with the plural electrical contacts of the substrate through plural wires, so that the fingerprint sensor die is electrically connected with the substrate. The covering adhesive layer is formed on a top surface of the fingerprint sensor die. The cover plate is attached on the covering adhesive layer. The mold compound layer is formed over the substrate. The fingerprint sensor die, the covering adhesive layer and the cover plate over the substrate are molded together through the mold compound layer, and the cover plate is exposed.

In accordance with another aspect of the present invention, there is provided a method for manufacturing a fingerprint identification module. The method comprising includes the following steps. In a step (a), plural fingerprint sensor dies are fixed on a substrate. Moreover, plural electrical contacts are formed on the substrate and arranged around each fingerprint sensor die. In a step (b), the plural fingerprint sensor dies are connected with the substrate by a wire-bonding process, so that the plural fingerprint sensor dies are electrically connected with the substrate. In a step (c), a covering adhesive layer is formed on top surfaces of the plural fingerprint sensor dies. In a step (d), a cover plate is formed on the covering adhesive layer. In a step (e), the plural fingerprint sensor dies and the covering adhesive layer are molded together through a mold compound layer. In a step (f), a cutting process is performed to produce plural individual fingerprint sensor units. In a step (g), the plural individual fingerprint sensor units are fixed on a flexible circuit board. In a step (h), the flexible circuit board is cut, and thus plural fingerprint identification modules are produced.

In accordance with a further aspect of the present invention, there is provided a method for manufacturing a fingerprint identification module. The method comprising includes the following steps. In a step (a), plural fingerprint sensor dies are fixed on a flexible circuit board. Moreover, plural electrical contacts are formed on the flexible circuit board and arranged around each fingerprint sensor die. In a step (b), the plural fingerprint sensor dies are connected with the flexible circuit board by a wire-bonding process, so that the plural fingerprint sensor dies are electrically connected with the flexible circuit board. In a step (c), a covering adhesive layer is formed on top surfaces of the plural fingerprint sensor dies. In a step (d), a cover plate is placed on the covering adhesive layer. In a step (e), the plural fingerprint sensor dies and the covering adhesive layer are molded together through a mold compound layer. In a step (f), a cutting process is performed. Consequently, plural individual plural fingerprint identification modules are produced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides a fingerprint identification module and a manufacturing method of the fingerprint identification module.

Figure 2:
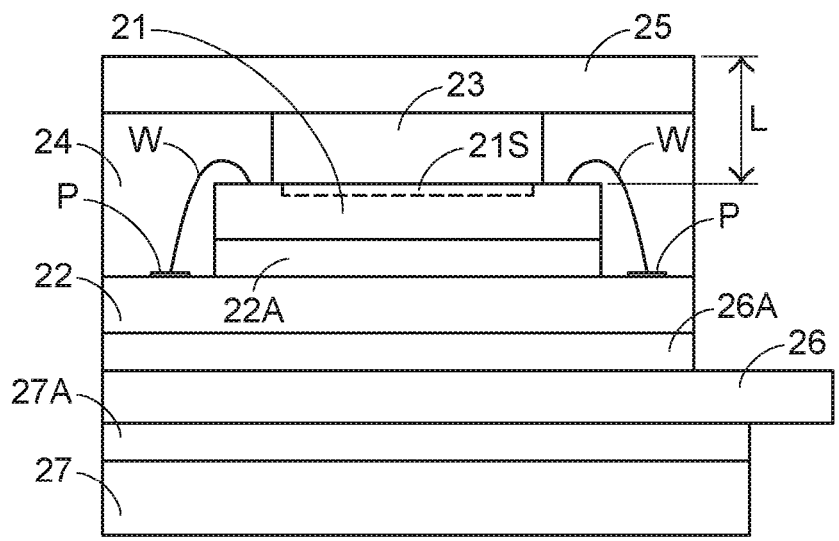
FIG. 2 is a schematic view illustrating the structure of a fingerprint identification module according to a first embodiment of the present invention.

FIG. 2 is a schematic view illustrating the structure of a fingerprint identification module according to a first embodiment of the present invention. As shown in FIG. 2, the fingerprint identification module 20 comprises a fingerprint sensor die 21, a substrate 22, a covering adhesive layer 23, a mold compound layer 24, a cover plate 25 and a flexible circuit board 26. In the embodiment of FIG. 2, the fingerprint identification module 20 further comprises a metal plate 27. The fingerprint sensor die 21 is attached on the substrate 22 through an adhesive layer 22A. The cover plate 25 is attached on the mold compound layer 24 through the covering adhesive layer 23. The substrate 22 is attached on the flexible circuit board 26 through a conductive layer 26A. For example, the conductive layer 26A is a soldering layer. The substrate 22 and the flexible circuit board 26 are combined together and electrically connected with each other through the soldering layer by a surface mount technology (SMT). The metal plate 27 is attached on the flexible circuit board 26 through an adhesive layer 27A.

In this embodiment, the substrate 22 is a rigid circuit board. Moreover, plural electrical contacts P are formed on the substrate 22 and arranged around the fingerprint sensor die 21. The fingerprint sensor die 21 is connected with the electrical contacts P through wires W, and thus the fingerprint sensor die 21 and the substrate 22 are electrically connected with each other. Moreover, the fingerprint sensor die 21 has a sensing region 21S. The covering adhesive layer 23 is formed on the sensing region 21S of the fingerprint sensor die 21. Moreover, the covering adhesive layer 23 is not contacted with the wires W.

An example of the fingerprint sensor die 21 of FIG. 2 includes but is not limited to a capacitive the fingerprint sensor die. After the fingerprint image is sensed by the fingerprint sensor die 21, the pixels of the fingerprint image are transferred to an external device (not shown) through the substrate 22 and the flexible circuit board 26. The fingerprint sensor die 21, the wires W, the plural electrical contacts P and the covering adhesive layer 23 are molded together through the mold compound layer 24. Due to the mold compound layer 24, the fingerprint identification module is isolated from the foreign dust. The cover plate 25 is used as a contact interface of between the user's finger and the fingerprint identification module. Moreover, even if the user's finger is frequently contacted with the surface of the fingerprint identification module, the cover plate 25 can protect the surface of the fingerprint identification module from damage. When the user's finger is placed on the cover plate 25, the fingerprint sensor die 21 can sense the fingerprint image of the finger. In an embodiment, the cover plate 25 is a glass plate or a ceramic plate. The metal plate 27 attached on the flexible circuit board 26 is used for increasing the flatness of the flexible circuit board 26. Moreover, the metal plate 27 can prevent formation of the dry solder joints between the wires W and the plural electrical contacts P. In some embodiments, the metal plate 27 is omitted.

Figure 1:
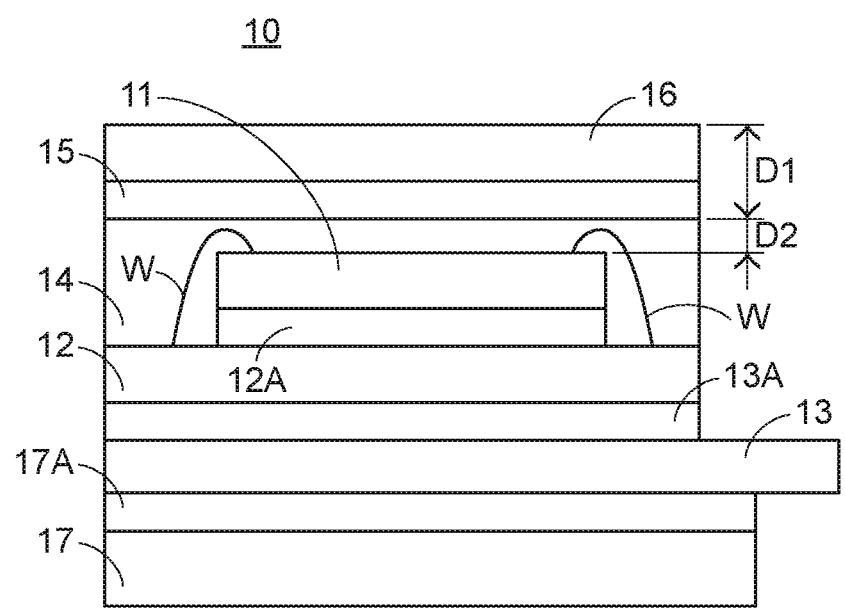
FIG. 1 is a schematic view illustrating the structure of a conventional fingerprint identification module.

Please refer to the structure of the fingerprint identification module 20 as shown in FIG. 2. In the fingerprint identification module 20, the covering adhesive layer 23 and the fingerprint sensor die 21 are molded together through the mold compound layer 24. As previously described in FIG. 1, the thickness of the mold compound layer overlying the fingerprint sensor die 11 is D2 and the overall thickness of the adhesive layer 15 and the cover plate 16 is D1. The thickness L between the top surface of the fingerprint sensor die 21 and the top surface of the cover plate 25 is smaller than the thickness (D1+D2). That is, the distance between the top surface of the fingerprint sensor die 21 and the cover plate 25 is smaller than the distance between the top surface of the fingerprint sensor die and the cover plate of the fingerprint identification module 10 as shown in FIG. 1. Consequently, the sensing sensitivity of the fingerprint sensor die 21 is enhanced. Since the overall thickness of the fingerprint identification module 20 is reduced, the fingerprint identification module 20 has the slim appearance.

Figure 3:
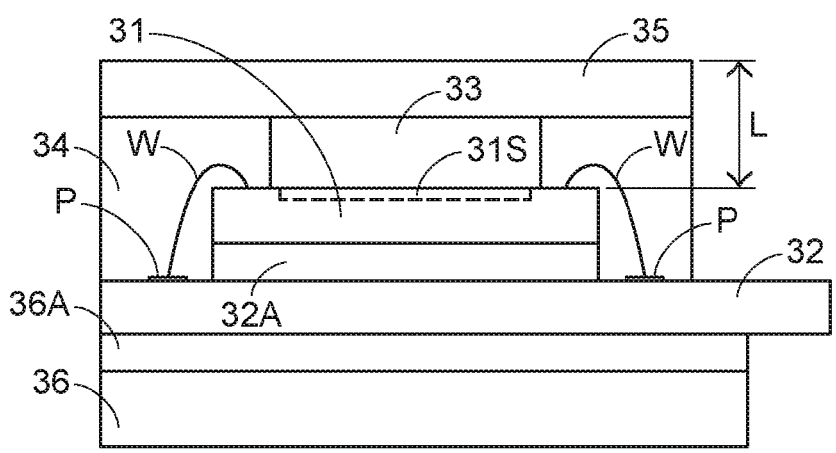
FIG. 3 is a schematic view illustrating the structure of a fingerprint identification module according to a second embodiment of the present invention.

FIG. 3 is a schematic view illustrating the structure of a fingerprint identification module according to a second embodiment of the present invention. As shown in FIG. 3, the fingerprint identification module 30 comprises a fingerprint sensor die 31, a flexible circuit board 32, a covering adhesive layer 33, a mold compound layer 34, a cover plate 35 and a metal plate 36. Moreover, plural electrical contacts P are formed on the flexible circuit board 32 and arranged around the fingerprint sensor die 31. As shown in FIG. 3, the fingerprint sensor die 31 is connected with the electrical contacts P through wires W. Moreover, the fingerprint sensor die 31 has a sensing region 31S. The fingerprint sensor die 31 is attached on the flexible circuit board 32 through an adhesive layer 32A. The metal layer 36 is attached on a bottom surface of the flexible circuit board 32 through an adhesive layer 36A.

In the embodiment of FIG. 2, the electrical contacts P are formed on the substrate. Whereas, in the embodiment of FIG. 3, the electrical contacts P are directly formed on the flexible circuit board 32. Since the fingerprint identification module of the embodiment of FIG. 3 is not equipped with the rigid circuit board, the thickness of the fingerprint identification module is further reduced.

Figure 4A:
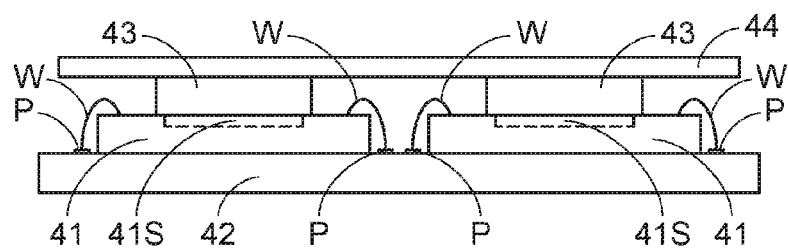
FIGS. 4A~4E are schematic views illustrating the steps of a method for manufacturing a fingerprint identification module according to an embodiment of the present invention.
Figure 4B:
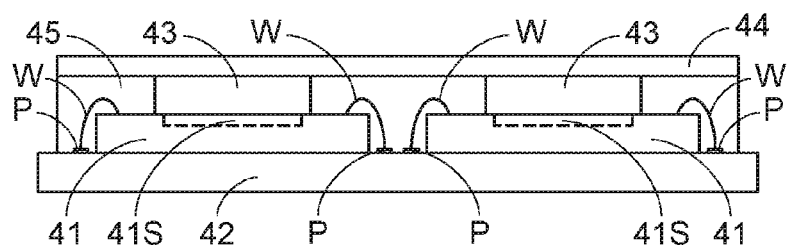
Figure 4C:
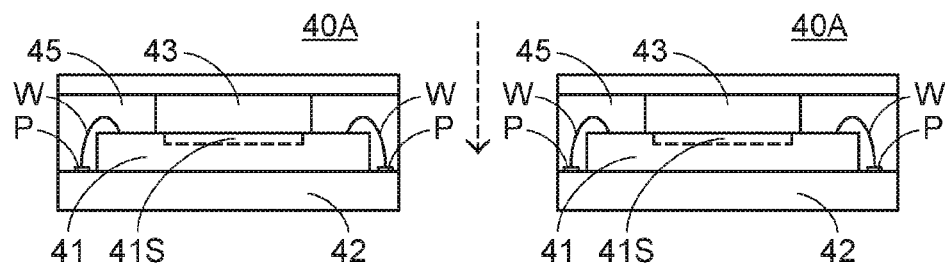
Figure 4D:
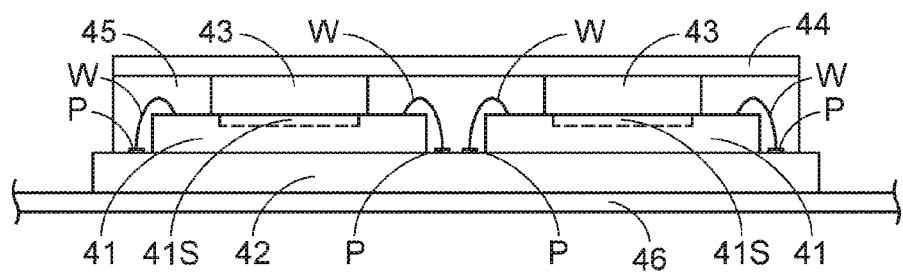
Figure 4E:
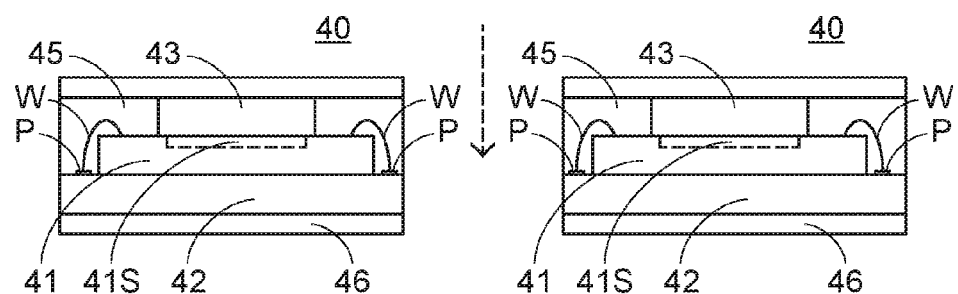

FIGS. 4A~4E are schematic views illustrating the steps of a method for manufacturing a fingerprint identification module according to an embodiment of the present invention. For succinctness, the covering adhesive layer 43 is shown in the drawings, but the other adhesive layers and the conductive layer are not shown in the drawings. Firstly, as shown in FIG. 4A, plural fingerprint sensor dies 41 are attached on the same substrate 42. For clarification, only two fingerprint sensor dies 41 are shown. In this embodiment, the substrate 42 is a rigid circuit board. Then, a wire-bonding process is performed on each fingerprint sensor die 41. Consequently, the fingerprint sensor dies 41 are electrically connected with the electrical contacts P of the substrate 42 through wires W. After the wire-bonding process is performed, covering adhesive layers 43 are formed on sensing regions 41S of top surfaces of the corresponding fingerprint sensor dies 41. Then, a cover plate 44 is attached on the covering adhesive layers 43. Then, a molding process is performed to form a mold compound layer 45. Consequently, the fingerprint sensor dies 41, the covering adhesive layers 43 and the cover plate 44 are molded together through the mold compound layer 45, and the top surface of the cover plate 44 is exposed (see FIG. 4B). Then, as shown in FIG. 4C, the plural fingerprint sensor dies 41 on the same substrate 42 are cut into plural individual fingerprint sensor units 40A. Then, as shown in FIG. 4D, the plural individual fingerprint sensor units 40A are attached on the same flexible circuit board 46 by a surface mount technology (SMT). Then, by cutting the flexible circuit board 45, plural individual fingerprint identification modules 40 are produced (see FIG. 4E).

Figure 5A:
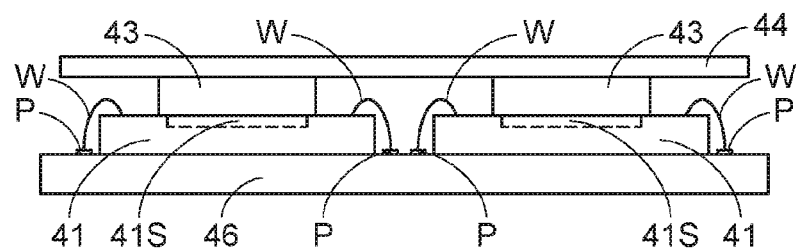
FIGS. 5A~5C are schematic views illustrating the steps of a method for manufacturing a fingerprint identification module according to another embodiment of the present invention.
Figure 5B:
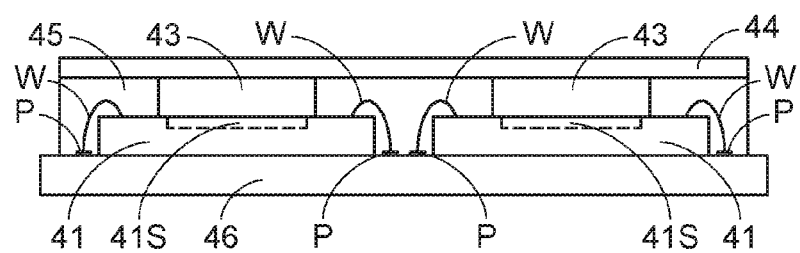
Figure 5C:
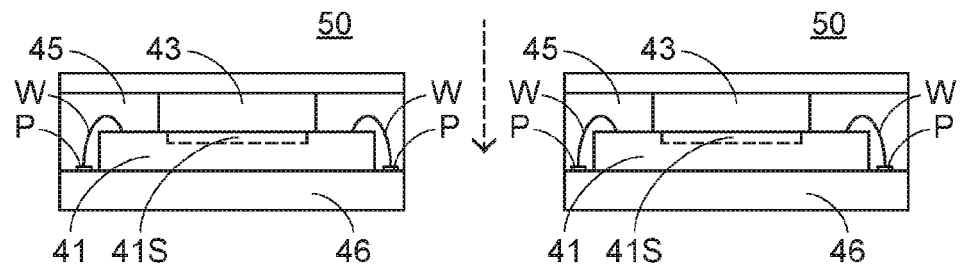

FIGS. 5A~5C are schematic views illustrating the steps of a method for manufacturing a fingerprint identification module according to another embodiment of the present invention. In this embodiment, the rigid circuit board 42 is omitted. That is, the flexible circuit board 46 is directly used as the substrate. Firstly, as shown in FIG. 5A, plural fingerprint sensor dies 41 are attached on the same flexible circuit board 46. For clarification, only two fingerprint sensor dies 41 are shown. Then, a wire-bonding process is performed on each fingerprint sensor die 41. Consequently, the fingerprint sensor dies 41 are electrically connected with the electrical contacts P of the flexible circuit board 46 through wires W. After the wire-bonding process is performed, covering adhesive layers 43 are formed on sensing regions 41S of top surfaces of the corresponding fingerprint sensor dies 41. Then, a cover plate 44 is attached on the covering adhesive layers 43. Then, a molding process as shown in FIG. 5B is performed. The step of FIG. 5B is similar to the step of FIG. 4B, and is not redundantly described herein. Then, as shown in FIG. 5C, the plural fingerprint sensor dies 41 on the same flexible circuit board 46 are cut into plural individual fingerprint identification modules 50.

In accordance with the manufacturing method of the present invention, the covering adhesive layers 43 and the fingerprint sensor dies 41 are molded together in the same step. In case that the mold compound layer 45 is suffered from warpage, the cover plate 45 has the similar warpage and deformation. Under this circumstance, the distance between the sensing surface of the fingerprint sensor die 41 and the cover plate 44 is kept unchanged. Consequently, the misjudgment problem resulted from warpage and deformation is overcome.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A method for manufacturing a fingerprint identification module, the method comprising steps of:
    (a) fixing plural fingerprint sensor dies on a substrate, wherein plural electrical contacts are formed on the substrate and arranged around each fingerprint sensor die;
    (b) connecting the plural fingerprint sensor dies with the substrate by a wire-bonding process, so that the plural fingerprint sensor dies are electrically connected with the substrate;
    (c) forming a covering adhesive layer on top surfaces of the plural fingerprint sensor dies, wherein the top surface of each fingerprint sensor die has a sensing region, the covering adhesive layer is formed on the corresponding sensing region, and the covering adhesive layer is not contacted with the plural wires;
    (d) placing a cover plate on the covering adhesive layer;
    (e) allowing the plural fingerprint sensor dies and the covering adhesive layer to be molded together through a mold compound layer, so that the distance between the top surface of the fingerprint sensor dies and the cover plate is kept unchanged;
    (f) performing a cutting process to produce plural individual fingerprint sensor units;
    (g) fixing the plural individual fingerprint sensor units on a flexible circuit board; and
    (h) cutting the flexible circuit board, so that plural fingerprint identification modules are produced.

2. The method according to claim 1, wherein the substrate is a rigid circuit board.

3. A method for manufacturing a fingerprint identification module, the method comprising steps of:
    (a) fixing plural fingerprint sensor dies on a flexible circuit board, wherein plural electrical contacts are formed on the flexible circuit board and arranged around each fingerprint sensor die;
    (b) connecting the plural fingerprint sensor dies with the flexible circuit board by a wire-bonding process, so that the plural fingerprint sensor dies are electrically connected with the flexible circuit board;
    (c) forming a covering adhesive layer on top surfaces of the plural fingerprint sensor dies, wherein the top surface of each fingerprint sensor die has a sensing region, the covering adhesive layer is formed on the corresponding sensing region, and the covering adhesive layer is not contacted with the plural wires;
    (d) placing a cover plate on the covering adhesive layer;
    (e) allowing the plural fingerprint sensor dies and the covering adhesive layer to be molded together through a mold compound layer, so that the distance between the top surface of the fingerprint sensor dies and the cover plate is kept unchanged; and (f) performing a cutting process to produce plural individual plural fingerprint identification modules.

* * * * *